(12) United States Patent
Hall et al.

(10) Patent No.: US 10,050,027 B2
(45) Date of Patent: Aug. 14, 2018

(54) QUILT PACKAGING SYSTEM WITH MATED METAL INTERCONNECT NODULES AND VOIDS

(71) Applicants: Indiana Integrated Circuits, LLC, South Bend, IN (US); University of Notre Dame du Lac, Notre Dame, IN (US)

(72) Inventors: Douglas C. Hall, South Bend, IN (US); Scott Howard, South Bend, IN (US); Anthony Hoffman, South Bend, IN (US); Gary H. Bernstein, Granger, IN (US); Jason M. Kulick, South Bend, IN (US)

(73) Assignee: University of Notre Dame du Lac, Notre Dame, IN (US)

( * ) Notice: Subject to any disclaimer, the term of this patent is extended or adjusted under 35 U.S.C. 154(b) by 0 days.

(21) Appl. No.: 15/448,026

(22) Filed: Mar. 2, 2017

(65) Prior Publication Data
US 2017/0179093 A1 Jun. 22, 2017

Related U.S. Application Data

(63) Continuation of application No. 14/158,079, filed on Jan. 17, 2014, now Pat. No. 9,620,473.
(Continued)

(51) Int. Cl.
*H01L 23/00* (2006.01)
*H01L 25/16* (2006.01)
*H01L 21/66* (2006.01)

(52) U.S. Cl.
CPC ............ *H01L 25/167* (2013.01); *H01L 22/12* (2013.01); *H01L 24/17* (2013.01); *H01L 24/70* (2013.01);
(Continued)

(58) Field of Classification Search
CPC ......... H01L 23/02; H01L 23/34; H01L 23/29; H01L 23/48; H01L 23/52; H01L 23/5385;
(Continued)

(56) References Cited

U.S. PATENT DOCUMENTS

| 4,931,021 A * | 6/1990 | Mohan | G02B 6/3833 |
| | | | 439/284 |
| 6,884,650 B2 * | 4/2005 | Lee | B81C 1/00269 |
| | | | 257/415 |

(Continued)

OTHER PUBLICATIONS

Bernstein, et al., "Quilt Packaging: High-Density, High-Speed Interchip Communications", IEEE Transactions on Advanced Packaging, vol. 30, No. 4, Nov. 2007.*

*Primary Examiner* — Marc Armand
*Assistant Examiner* — Younes Boulghassoul
(74) *Attorney, Agent, or Firm* — The Webb Law Firm

(57) ABSTRACT

First and second integrated devices each have an optical component and a plurality of interconnect structures disposed one edge thereon. The first edge surface of the second integrated device is positioned contiguous to the first edge surface of the first integrated device. The interconnect structures disposed on the first integrated device are in physical contact with the interconnect structures disposed on the edge surface of the second integrated device so as to provide alignment for conveying at least one signal between the optical components on the first and second integrated devices.

8 Claims, 3 Drawing Sheets

Related U.S. Application Data

(60) Provisional application No. 61/849,090, filed on Jan. 18, 2013.

(52) U.S. Cl.
CPC ............... *H01L 2224/175* (2013.01); *H01L 2224/1718* (2013.01)

(58) Field of Classification Search
CPC ......... H01L 24/06; H01L 24/14; H01L 24/17; H01L 24/30; H01L 24/33; H01L 24/64; H01L 24/67; H01L 24/70; H01L 25/167
USPC ....... 257/459, 668, 676, 685, 686, 689, 698, 257/723, 724, 730, 777; 438/107, 108, 438/110, 113, 129, 460, 462, 612, 618, 438/666, 674
See application file for complete search history.

(56) References Cited

U.S. PATENT DOCUMENTS

| | | | | |
|---|---|---|---|---|
| 7,608,919 B1* | 10/2009 | Bernstein | ................ | H01L 23/60 257/685 |
| 2008/0285978 A1* | 11/2008 | Choi | ................ | H04B 10/25752 398/139 |
| 2013/0105984 A1* | 5/2013 | Rathburn | ........... | H01R 12/7076 257/773 |

\* cited by examiner

QUILT PACKAGING SYSTEM WITH MATED METAL INTERCONNECT NODULES AND VOIDS

CROSS REFERENCE TO RELATED APPLICATIONS

This application is a continuation of U.S. patent application Ser. No. 14/158,079, filed Jan. 17, 2014 which claims the benefit of U.S. Provisional Patent Application No. 61/849,090, filed Jan. 18, 2013, both of which are incorporated herein by reference in their entirety.

BACKGROUND OF THE INVENTION

Field of the Invention

The present invention relates generally to microchips and systems and devices employing microchips.

Description of Related Art

Quilt packaging is a new paradigm for inter-chip electrical communication. In quilt packaging conducting nodules that protrude from the vertical facets of integrated circuits are used for a dense, enhanced speed, and reduced-power interface between multiple dies within a package. See, e.g., G. H. Bernstein, Q. Liu, Z. Sun, and P. Fay, *Quilt-packaging: a new paradigm for inter-chip communication*; Proc. IEEE 7th Electronics Packaging Technology Conference, 2005, pp. 1-6; U.S. Pat. Nos. 7,612,443 and 8,623,700; and co-pending U.S. patent application Ser. No. 14/090,993, filed on Nov. 26, 2013, all of which are incorporated herein by reference. Quilt packaging can not only address the issues of communication among integrated circuits (ICs) (one of the major bottlenecks in the development of electronic systems), but can also simultaneously improve multiple parameters of system performance including bandwidth, system size and weight, power consumption and cost. See, e.g., G. H. Bernstein, Q. Liu, M. Yan, Z. Sun, D. Kopp, W. Porod, G. Snider, and P. Fay, *Quilt packaging: high-density, high-speed interchip communications*, IEEE Trans. Advanced Packaging, vol. 30, no. 4, November 2007.

A photonic integrated circuit (PIC) combines the function of several individual photonic components into a single device. For example, a PIC may include a light source, a region designed to enhance the interaction of the generated light with a substance under test, and a detector. While such functions can be achieved with individual components and optical elements such as lenses, integrating these functions into a single device could lead to drastic reductions in the cost, size and complexity of the sensing system.

On-chip integration of a quantum cascade (QC) laser with a passive semiconductor waveguide using the conventional semiconductor processing technique is known. But since the QC laser wafer is very expensive, integrating a waveguide and detector on it is not cost effective and at the same time the detector quality is not optimized.

Unfortunately, quite often the various components of a sensing system cannot all be created from the same material because of physical limitations and costs. In the case of compact low cost on-chip mid infrared detection using a QC laser, it is important to use different wafer material for the waveguide and detector. As a consequence, an integrated system may require components made from several different materials, and thus a method of achieving low loss optical coupling between the individual components is required.

Here, a method is presented for joining multiple components into a single device to within the accuracy required for low loss optical coupling.

SUMMARY OF THE INVENTION

A quilt packaging system connects a first integrated device having a plurality of edge surfaces at least a first edge surface of which comprises one or more first interconnecting structures disposed thereon, and includes a component having at least one of a signal input and output to a second integrated device having a plurality of edge surfaces at least a first edge surface of which comprises one or more second interconnecting structures disposed thereon, and includes a component having at least one of a signal input and output. The first edge surface of the second integrated device is positioned contiguous to the first edge surface of the first integrated device. At least one of the one or more first interconnecting structures disposed on the first edge surface of the first integrated device is configured to mate with at least one of the one or more second interconnecting structures disposed on the first edge surface of the second integrated device so as to provide at least alignment for conveying at least one signal between the at least one of a signal input and output of the first integrated device and the at least one of a signal input and output of the second integrated device at the first edge surfaces of the first and second integrated devices.

A method for interconnecting integrated circuit chips includes forming mating interconnecting structures on at least one edge of a first integrated circuit chip including at least a first optical component and on at least one edge of a second integrated circuit chip including at least a second optical component, the mating interconnecting structures positioned to optically align the at least the first optical component on the first integrated circuit chip with the at least the second optical component on the second integrated circuit chip, and mating the interconnecting structures on the first integrated circuit chip with the interconnecting structures on the second integrated circuit chip to optically align the at least the first optical component with the at least the second optical component. The method may further include bonding the interconnecting structures on the first integrated circuit chip to the interconnecting structures on the second integrated circuit chip by a process such as soldering or adhesive bonding.

In accordance with the present invention, optical quilt packaging is implemented for chip-to-chip integration of photonic devices such as laser, waveguide and photodetector devices. For compact low cost on chip mid infrared detection using a QC laser, it is important that wafer materials different from that used for the QC laser be employed for the waveguide and detector. In accordance with one aspect of the present invention, quilt packaging is employed to integrate the chips after separately fabricating them. Using quilt packaging it is possible to integrate widely different wavelength QC lasers, waveguides made on a comparably low cost wafers (silicon on insulator, SOI) and better detectors for low cost, improved quality liquid phase detection.

On chip integration of a quantum cascade (QC) laser with waveguide and detector is already reported [1], but to obtain greater flexibility in laser operating wavelength and better quality detection, chip to chip optical integration still has a long way to go. The quilt packaging approach of the present invention can be a good solution for chip-to-chip optical integration as different material wafers could be used in the fabrication of QC lasers, waveguides and detectors, providing both reduced cost and high performance application.

Chip-to-chip optical connections are achieved by bringing the facets of emitters, detectors, and waveguides on each of the chips into close proximity. The facets of the waveguides are defined by cleaving the materials or using a process such as deep reactive ion etching to define the facets. A waveguide-waveguide alignment method according to one aspect of the present invention is passive in that it uses interlocking lithographically defined nodules or a combination of interlocking nodules and notches to provide lateral alignment between chips.

According to another aspect of the present invention, the depth of the notches and length of the nodules can be selected to control the inter-chip distance. Making the notches deeper than the length of the nodules can be used to reduce the inter-chip spacing to reduce the waveguide-waveguide coupling loss. The inter-chip gap can also be filled with an index matching material to improve the coupling loss or flowing a liquid in the channel formed by the inter-chip gap can change the optical properties of the interconnect, and allow analysis of the fluid. The nodules and notches can also be metalized to allow for permanently connecting them together by, for example, soldering, and/or to provide a high bandwidth electrical connection between the two chips that can be used for chip/component input/output. The process of the present invention minimizes the changes to conventional processing of the individual components and is thus is easily integrated into conventional semiconductor processes, maintains electrical continuity across several chips, and scales with high volume production.

In conventional quilt packaging techniques conductive nodules protruding from the sides of ICs provide means of a direct edge-to-edge interconnection between the ICs in a quilt-like fashion. In optical quilt packaging it is not always necessary to exchange electrical signals between the ICs, the present invention employs using the nodules and nodules and notches as a mean of alignment between the waveguides of different chips. In the proposed optical quilt packaging, optical transmission between the emitters, detectors, and waveguides of different chips would make the effective photonic device integration.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
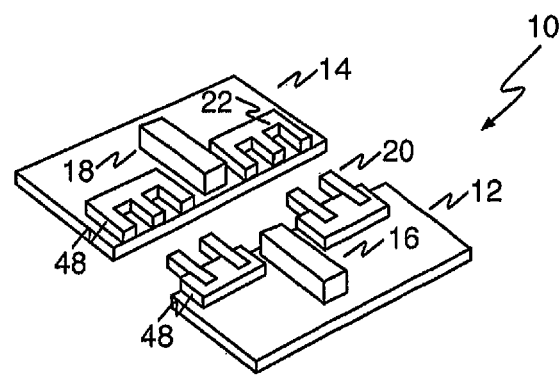
FIG. 1 is an isometric drawing showing how two optical components on two different integrated circuit chips can be optically coupled using the teachings of the present invention.

Referring first to FIG. 1, an isometric drawing shows how two optical components on two different integrated circuit chips can be optically coupled to one another using the teachings of the present invention. An assembly 10 is formed from a first integrated circuit chip 12 and a second integrated circuit chip 14. First integrated circuit chip 12 includes a first optical component 16 disposed on it. Optical component 16 may be an emitter, such as an integrated circuit laser, a detector, or a waveguide. Similarly, second integrated circuit chip 14 includes a second optical component 18 disposed on it. Optical component 18 may be an emitter, such as an integrated circuit laser, a detector, or a waveguide.

Integrated circuit chip 12 includes a plurality of nodules (one of which is identified by reference numeral 20) extending laterally outward from one of its side edges. In some embodiments of the present invention, the nodules are formed from a metal, for example damascene copper formed in the semiconductor material or a dielectric layer. In other embodiments, the nodules may be formed from the semiconductor layer or from a material deposited on the semiconductor layer, with a metal layer formed thereon. Integrated circuit chip 14 includes a plurality of voids or notches (one of which is identified by reference numeral 22) extending laterally inward from one of its side edges. The nodules 20 are formed at locations along the edge of integrated circuit chip 12 at positions selected to correspond to positions of the voids or notches 22 of integrated circuit chip 14 so that integrated circuit chips 12 and 14 may be connected to one another by urging the nodules 20 of integrated circuit chip 12 into the voids or notches 22 of integrated circuit chip 14. A metal layer is preferably formed on the side edges of the notches so that they may be connected to the nodules by a process such as soldering. In one embodiment, a layer of copper may first be formed followed by a layer of electroless tin.

Optical components 16 and 18 are positioned on their respective integrated circuit chips 12 and 14 such that when the nodules 20 of integrated circuit chip 12 are engaged in the voids or notches 22 of integrated circuit chip 14, the inputs/outputs of optical components 16 and 18 are in alignment to facilitate optical signal transfer between the two.

Figure 2:
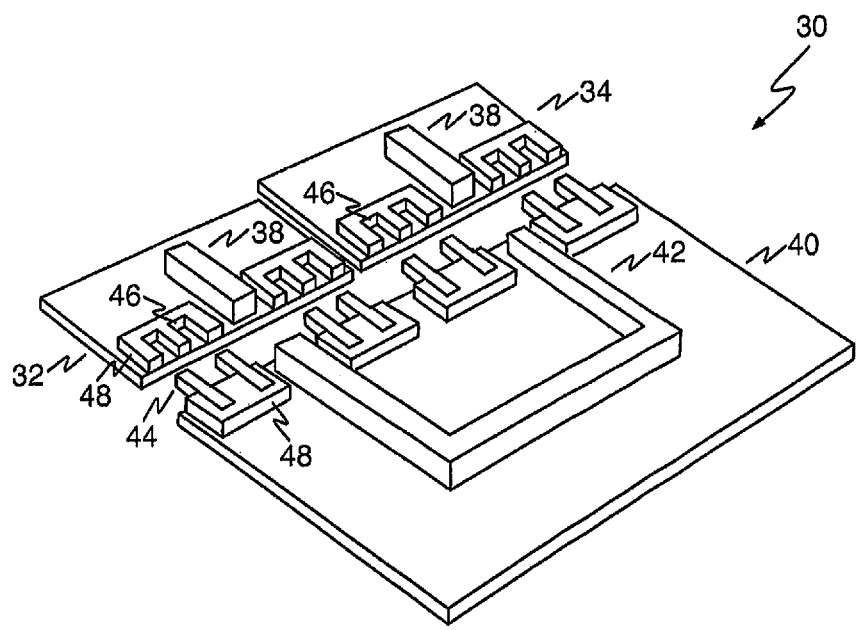
FIG. 2 is an isometric drawing showing how two optical components on two different integrated circuit chips can be optically coupled to one another via a waveguide disposed on a third integrated circuit using the teachings of the present invention.

Referring now to FIG. 2, an isometric drawing shows how two optical components on two different integrated circuit chips can be optically coupled to one another via a waveguide disposed on a third integrated circuit using the teachings of the present invention. An assembly 30 is formed from a first integrated circuit chip 32 and a second integrated circuit chip 34. As in the embodiment illustrated in FIG. 1, first integrated circuit chip 32 of system 30 includes a first optical component 36 disposed on it. Optical component 36 may be an emitter, such as an integrated circuit laser, a detector, or a waveguide. Similarly, second integrated circuit chip 34 includes a second optical component 38 disposed on it. Optical component 38 may be an emitter, such as an integrated circuit laser, a detector, or a waveguide.

A third integrated circuit chip 40 includes a waveguide 42 formed thereon. Integrated circuit chip 40 includes a plurality of nodules (one of which is identified by reference numeral 44) extending laterally outward from one of its side edges. Integrated circuit chips 32 and 34 both includes a plurality of voids or notches (one of which on each of chips 32 and 34 is identified by reference numeral 46) extending laterally inward from one of its side edges. The nodules 44 are formed at locations along the edge of integrated circuit chips 32 and 34 at positions selected to correspond to positions of the voids or notches 46 of integrated circuit chip 40 so that integrated circuit chips 32 and 34 may be connected to integrated circuit chip 40 by urging the nodules 44 of integrated circuit chip 40 into the voids or notches 46 of integrated circuit chips 32 and 34.

As may be noted from an examination of FIGS. 1 and 2, the nodules 44 of integrated circuit chip 40 and the voids or notches 46 of integrated circuit chips 32 and 34 are shown formed on raised regions 48. These regions are shown to highlight the nodules 44 and the voids or notches 46. Persons of ordinary skill in the art will appreciate that such raised regions 48 are not necessary for practicing the present invention and that nodules 44 and the voids or notches 46 can be created without forming such regions. In embodiments where such regions 48 are employed persons of ordinary skill in the art will appreciate that they may be formed by using appropriate known masking and surface etch-back steps on the chips 32, 34, and 40 or by forming layers on the surfaces of the chips 32, 34, and 40 from known materials using known techniques.

As in the embodiment shown in FIG. 1, the optical components 36, 38, and 42 are positioned on their respective integrated circuit chips 32, 34, and 40 such that when the nodules 44 of integrated circuit chip 40 are engaged in the voids or notches 46 of integrated circuit chips 32 and 34, the inputs/outputs of optical components 36 and 38 are in alignment with the ends of waveguide 42 on integrated circuit chip 40 to facilitate optical signal transfer between the optical components 36 and 38 via waveguide 42. As in the embodiment shown in FIG. 1, the nodules are either formed from a metal or have a metal layer formed thereon, and a metal layer is preferably formed on the side edges of the nodules 44 and the notches 46 so that the nodules and notches may be connected together by a process such as soldering. In one embodiment, the metal layer may be formed from a deposited layer of copper followed by a layer of electroless tin.

Persons of ordinary skill in the art will appreciate that the arrangements shown in FIGS. 1 and 2 allow an optical system to be designed such that each individual optical component may be fabricated on a substrate formed from a material most compatible with the nature of the individual optical component. Such skilled persons will also appreciate that, while both FIGS. 1 and 2 show the interconnect structure of the present invention disposed along a single side edge of each of the integrated circuit chips 12, 14, 32, 34, and 40, embodiments of the present invention are contemplated wherein nodules and/or voids or notches can be formed on more than one side edge of each integrated circuit chip, thus allowing for more densely packed and complex systems than those shown in FIGS. 1 and 2. The arrangement of the nodules and notches in FIG. 2 can be reversed in whole or in part. For example, one or both of chips 32 and 34 can include one or more nodules 44 and chip 40 can include corresponding notches 46, or as will be shown with reference to FIG. 5, different arrangements of interlocking nodules can be used. Varying the arrangements can be used to "key" the interlocking system to avoid incorrect assembly and ensure that multiple chips are properly interconnected.

Figures 3, 4:
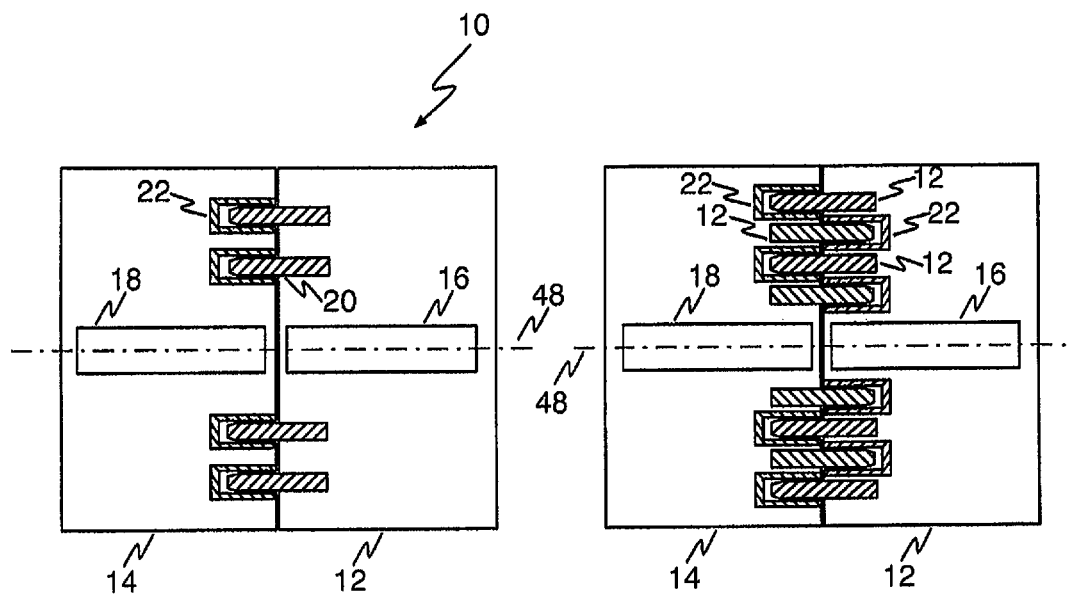
FIG. 3 is a top view showing two integrated circuits coupled together in accordance with a first illustrative embodiment of the present invention.
FIG. 4 is a top view showing two integrated circuits coupled together in accordance with a second illustrative embodiment of the present invention.

Referring now to FIG. 3, a top view of system 10 of FIG. 1 is shown with integrated circuit chips 12 and 14 including optical components 16 and 18, respectively. Integrated circuit chips 12 and 14 are coupled to one another by engaging nodules 20 into voids or notches 22. As can be seen from an examination of FIG. 3, in the illustrative embodiment shown therein the voids or notches 22 are relatively positioned such that, when the two are engaged, the optical components 16 and 18 are aligned together along an optical axis (shown at a dashed line identified by reference numeral 48). As shown by the cross hatching in FIG. 3, the nodules are either formed from a metal or have a metal layer deposited thereon, and a metal layer is preferably formed on the side surfaces of the notches 22 so that the nodules and the notches may be connected together by a process such as soldering. In one embodiment the metal layer may be formed from a deposited layer of copper followed by a layer of electroless tin.

As can also be seen from an examination of FIG. 3, in the illustrative embodiment shown therein the voids or notches 22 are formed to be deeper than the lengths of nodules 20. This allows integrated circuit 12 to be reliably positioned (e.g., seated against) with respect to integrated circuit 14 to ensure that the chips are separated by a minimum possible distance. In addition, it can be seen that the distal ends of nodules 20 may be somewhat tapered to facilitate engagement of the nodules 20 into the voids or notches 22. Persons of ordinary skill in the art will appreciate that the same interconnect geometries may be used for embodiments such as the one depicted in FIG. 2.

Referring now to FIG. 4, a top view of another embodiment of the present invention is illustrated. As in the embodiment shown in FIG. 3, integrated circuit chips 12 and 14 include optical components 16 and 18, respectively, are coupled to one another by engaging nodules 20 into voids or notches 22. As shown by the cross hatching in FIG. 4, the nodules are either formed from a metal or have a metal layer formed thereon, and a metal layer is preferably formed on the side surfaces of the notches 22 so that the nodules and notches may be connected together by a process such as soldering. In one embodiment the metal layer may be formed from a deposited layer of copper followed by a layer of electroless tin.

As can be seen from an examination of FIG. 4, in the illustrative embodiment shown therein the voids or notches 22 are relatively positioned such that, when the two are engaged, the optical components 16 and 18 are aligned together along an optical axis (shown at a dashed line identified by reference numeral 48). In the illustrative embodiment depicted in FIG. 4, the nodules 20 and the voids or notches 22 are not all disposed on one of the integrated circuit chips 12 and 14, but alternate on each of integrated circuit chips 12 and 14.

As can be seen from an examination of FIG. 4, in the illustrative embodiment shown therein the voids or notches 22 are also formed to be deeper than the lengths of nodules 20. This allows integrated circuit 12 to be reliably positioned with respect to (e.g., seated against) integrated circuit 14 to ensure that a minimum possible distance separates the chips. In addition, it can be seen that the distal ends of nodules 20 may be somewhat tapered to facilitate engagement of the nodules 20 into the voids or notches 22. Persons of ordinary skill in the art will appreciate that the same interconnect geometries may be used for embodiments such as the one depicted in FIG. 2.

Figures 5, 6:
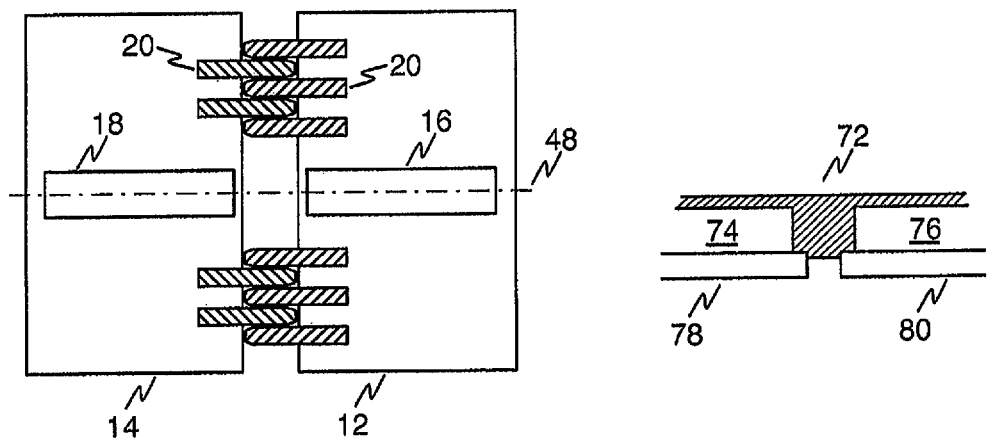
FIG. 5 is a top view showing two integrated circuits coupled together in accordance with a third illustrative embodiment of the present invention.
FIG. 6 is a cross sectional view showing an index-matching material disposed between the end faces of optical elements on different integrated circuits joined in accordance with the teachings of the present invention.

Referring now to FIG. 5, a top view of another embodiment of the present invention is illustrated. As in the embodiments shown in FIGS. 3 and 4, integrated circuit chips 12 and 14 include optical components 16 and 18. In the embodiment of FIG. 5, both integrated circuit chips 12 and 14 include nodules 20. The nodules 20 are spaced apart by a distance slightly larger than the width of each nodule and are also offset from one another so that nodules from one of the integrated circuit chips 12 and 14 are engaged in spaces between adjacent pairs of the nodules in the other one of integrated circuit chips 12 and 14 in order to align both optical components along optical axis 48. As shown by the cross hatching in FIG. 3, the nodules are either formed from a metal or have a metal layer formed thereon, and a metal layer is preferably formed on the side surfaces of the notches 22 so that the nodules and notches may be connected together by a process such as soldering. In one embodiment, the metal layer may be formed from a deposited layer of copper followed by a layer of electroless tin.

In the embodiment shown in FIG. 5, the nodules protruding from the sides of the integrated circuit chips 12 and 14 are used in a 'zipper' like fashion, generally in a friction-fit manner, as shown in to align the optical components of different chips to facilitate chip-to-chip optical transmission.

In fabricating waveguides on silicon-on-insulator (SOI) wafers single mode encapsulation in the waveguide is very important. Optical waveguides in SOI have the benefit of the index step between silicon and the buried SiO$_2$ layer, providing vertical confinement of light as noted in M. Schnarrenberger, L. Zimmermann, T. Mitze, J. Brans, and K Petermann, *Facet preparation of SOI waveguides by etching and cleaving compared to dicing and polishing*, IEEE International Conference on Group IVPhotonics, 2004, pp. 72-74. To achieve the single mode condition, the rib width W of the waveguide and the etching depth H-h can be chosen using the formula of Equation 1.

$$\frac{W}{H} \leq 0.3 + \frac{r}{\sqrt{(1-r^2)}}, r = \frac{h}{H} \geq 0.5 \qquad \text{Equation 1}$$

where H is the height of the top Si layer and h is the height from top of the buried oxide layer to the bottom of the etched part of the top Si layer.

In fabricating the optical quilt packaging structure according to one aspect of the present invention, the process is divided into two parts. In the first part nodules are fabricated on the edge of the chips and in the second part the photonic devices are fabricated on the chips. In the conventional quilt packaging process the nodules are fabricated during back-end processing. In accordance with one aspect of the present invention the order may optionally be changed so that photonic devices fabricated on the chips are not subjected to sputtering and chemical mechanical polishing (CMP) processes after they are fabricated.

Figure 7:
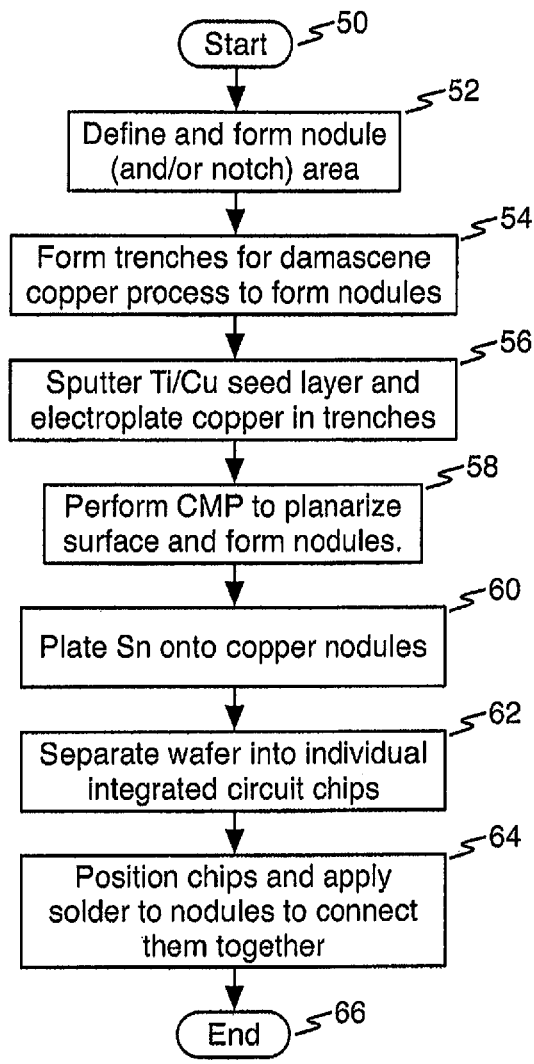
FIG. 7 is a flow chart showing an illustrative fabrication process for the system of the present invention.

Referring now to FIG. 7, a fabrication process flow for fabricating an optical quilt packaging structure employing waveguides is shown. The process illustrated in FIG. 7 does not include the process steps necessary for formation of the optical components on the integrated circuit chips. Persons of ordinary skill in the art are presumed to be capable of performing such processing steps.

The process starts at reference numeral 50. At reference numeral 52 a photolithographic process is performed to define the nodule (and/or notch) area and then deep reactive ion etching (DRIE) is used to form trenches for the nodules. A Bosch DRIE process (see, e.g., R. B. Bosch Gmbh, U.S. Pat. No. 4,855,017, U.S. Pat. No. 4,784,720, and German Patent 4241 045C1, 1994), which alternates between an SF$_6$ etch cycle and a C$_4$F$_8$ sidewall passivation cycle may be used to perform this process.

Next, as shown at reference numeral 54, trenches are formed for the well-known damascene copper process that will be employed to form the nodules. Then, an adhesion layer is applied and the nodules are formed by a plating or other additive manufacturing process. In one embodiment, as shown at reference numeral 56, a thin Ti/Cu seed layer is sputtered and copper electroplating is performed to fill the trenches. At this point, the notches are also metallized. After that, as shown at reference numeral 58, a chemical mechanical polishing process (CMP) is performed to planarize the surface and form the nodules. In one exemplary embodiment, the nodules are 15 µm wide, 100 µm long and 20 µm thick. Alternately, the nodules may be formed by etching them out of the semiconductor material or out of a layer of another material formed on the semiconductor material and then covered with a deposited metal layer as taught herein. As taught herein, interlocking nodules can be employed. Persons of ordinary skill in the art will appreciate that lengths, widths, and depths of the interlocking features in any given embodiment according to the present invention are a matter of routine design choice. After forming the nodules, the wafer is separated into individual integrated circuit chips. Next, conductive material is applied. In the particular embodiment illustrated in FIG. 7, at reference numeral 60 Sn is electrolessly plated on the chips to coat only the copper surface at the sidewalls of the portion of the nodule that protrudes from the edge of the integrated circuit chip. Next, at reference numeral 62, a DRIE processing step (e.g., the Bosch process) is used again to etch vertically all way through the wafer to separate the chips. In actual fabrication process many chips can be simultaneously fabricated from one large wafer or from a plurality of wafers.

At reference numeral 64, the chips to be interconnected are positioned together with the nodules received in the notches and are connected by soldering them together. This process is essentially the same regardless of which of the embodiments shown in FIGS. 3 through 5 is employed. The process ends at reference numeral 66.

The second part of the fabrication is to form waveguides on the quilt packaging structure for optical transmission. Either a DRIE process or a reactive ion etching (RIE) process can be employed. In one embodiment, positive photoresist AZ1813 may be used to pattern the waveguide as well as a trench on either side of the waveguide. An auto stepper system may be used to perform the lithographic process. Etching Si in RIE may employ, for example, a mixture of SF$_6$ (about 15 sccm) and O$_2$ (about 15 sccm) with an etch rate of 400 nm/min. The pressure of the process may be about 40 mTorr and the power used may be about 75 watt. SF$_6$ may be used to etch the Si substrate and O$_2$ may be added to etch photoresist layer from the top to eliminate the polymer formation in the photoresist layer due to high-energy interaction between the SF$_6$ ion and the photoresist. Using presently available technology, waveguides may typically vary from 1 µm-6 µm in width with trenches of 1 µm-15 µm wide in between them may be successfully fabricated.

The airgap between the two chips (and the waveguides) should be minimized. In an exemplary optical quilt packaging process, the chips can actually butt together or can be separated by a short distance. If the nodules are recessed appropriately, gaps in the order of about 4-10 microns or less can be realized.

The male-female coupling structure shown in FIGS. 1 through 3, where the male nodules are protruding from the edge of the chip as before, but the female nodules are not provided, may be used to reduce the chip-to-chip distance. The distance between the waveguides can be reduced up to 0.5 µm by this way, which can significantly increase the normalized transmission, e.g., to around 80%.

According to another aspect of the present invention, shown with reference to FIG. 6 to which attention is now drawn, an index matching material 72 of refractive index in the range of about 2-2.8, such as $As_2S_3$ chalcogenide glass (refractive index 2.4), can be formed in the air gap between two Si waveguides 74 and 76, disposed on integrated circuit chips 78 and 80, respectively, to increase normalized optical transmission to between about 75-90%. A material such as $As_2S_3$ chalcogenide glass (refractive index 2.4 may be selected as the index matching material. To fill the air gap in between the waveguides 74 and 76, a solution of $As_2S_3$ in n-propylamine (0.2 g/ml) can be spun on chips 78 and 80 containing the waveguides 74 and 76. The spin speed may be varied from 3000 rpm to 5000 rpm to vary the glass thickness. After spinning the films are baked at 100° C. for 30 min to evaporate the solvent. The thickness of the spin-on glass depends on the spin speed.

Modification of the existing quilt packaging technique for its optical application provides a new way for better quality and low cost chip-to-chip optical integration. At the same time the optical quilt packaging provides a great opportunity for optical source, sensor and detector optimization. Persons of ordinary skill in the art will appreciate that, because the interconnecting nodules or nodule/notch pairs are metallized, they may also be used as electrical interconnects between the different chips.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

The invention claimed is:

1. A quilt packaging system comprising:
a first integrated device having a plurality of edge surfaces at least a first edge surface of which comprises one or more first interconnecting structures disposed thereon, the first integrated device including a component having at least one of a signal input and output; and
a second integrated device having a plurality of edge surfaces at least a first edge surface of which comprises one or more second interconnecting structures disposed thereon, the second integrated device including a component having at least one of a signal input and output;
wherein the first edge surface of the second integrated device is positioned contiguous to the first edge surface of the first integrated device, and
wherein at least one of the one or more first interconnecting structures disposed on the first edge surface of the first integrated device is configured to mate with at least one of the one or more second interconnecting structures disposed on the first edge surface of the second integrated device so as to provide at least alignment for conveying at least one signal between the at least one of a signal input and output of the first integrated device and the at least one of a signal input and output of the second integrated device at the first edge surfaces of the first and second integrated devices,
the first interconnecting structures comprise one or more spaced apart interconnect nodules; and
the second interconnecting structures comprise one or more spaced apart interconnect voids, wherein each void includes a metal layer formed on side edges of the void.

2. The quilt packaging system of claim 1 wherein:
the component on the first integrated device is a first optical component, the component on the second integrated device is a second optical component, and
the one or more interconnect nodules disposed on the first edge surface of the first integrated device is configured to be at least partially disposed within the one or more interconnect voids disposed on the first edge surface of the second integrated device so as to provide optical alignment for conveying at least one optical signal between the first and second optical components.

3. The quilt packaging system of claim 2 wherein each of the first and second optical components is one of a laser, a waveguide, and a detector.

4. The quilt packaging system of claim 2 further including an index-matching substance disposed in an optical path between the first and second optical components on the first and second integrated devices.

5. The quilt packaging system of claim 1 wherein the one or more interconnect nodules disposed on the first edge surface of the first integrated device are formed from a conducting material.

6. The quilt packaging system of claim 1 wherein the one or more interconnect nodules disposed on the first edge surface of the first integrated device and edge surfaces defining the one or more interconnect voids disposed on the first edge surface of the second integrated device are formed from a metal.

7. The quilt packaging system of claim 6 wherein the metal is copper.

8. The quilt packaging system of claim 6 wherein the one or more interconnect nodules disposed on the first edge surface of the first integrated device are soldered to the edge surfaces of the one or more interconnect voids disposed on the first edge surface of second integrated device.

* * * * *